United States Patent
Shibuya et al.

(10) Patent No.: US 11,345,990 B2
(45) Date of Patent: May 31, 2022

(54) MGO SINTERED SPUTTERING TARGET

(71) Applicant: JX Nippon Mining & Metals Corporation, Tokyo (JP)

(72) Inventors: Yoshitaka Shibuya, Ibaraki (JP); Satoyasu Narita, Ibaraki (JP); Hiroki Kajita, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 16/648,842

(22) PCT Filed: Mar. 6, 2019

(86) PCT No.: PCT/JP2019/008832
§ 371 (c)(1),
(2) Date: Mar. 19, 2020

(87) PCT Pub. No.: WO2020/054104
PCT Pub. Date: Mar. 19, 2020

(65) Prior Publication Data
US 2020/0263291 A1 Aug. 20, 2020

(30) Foreign Application Priority Data

Sep. 13, 2018 (JP) .............................. JP2018-171714

(51) Int. Cl.
*H01J 37/34* (2006.01)
*C23C 14/34* (2006.01)
*G11B 5/851* (2006.01)

(52) U.S. Cl.
CPC .......... *C23C 14/3414* (2013.01); *G11B 5/851* (2013.01); *H01J 37/3426* (2013.01)

(58) Field of Classification Search
None
See application file for complete search history.

(56) References Cited

U.S. PATENT DOCUMENTS 8,454,933 B2 6/2013 Nagano et al.
9,824,868 B2 11/2017 Okamoto et al.
(Continued)

FOREIGN PATENT DOCUMENTS

CN 105330262 A 2/2016
JP H10-158826 A 6/1998
(Continued)

OTHER PUBLICATIONS

H. Kimura et al., "Misorientation Analysis of Plastic Deformation of Austenitic Stainless Steel by EBSD and X-Ray Diffraction Methods", Transactions of the Japan Society of Mechanical Engineers Series A, vol. 71, Issue 712, pp. 1722-1728, Dec. 2005.
(Continued)

*Primary Examiner* — Jason Berman
(74) *Attorney, Agent, or Firm* — Howson & Howson LLP

(57) ABSTRACT

A MgO sintered sputtering target, wherein a ratio of GOS (Grain Orientation Spread) being 0° to 1° is 75% or higher. A MgO sintered sputtering target, wherein a ratio of KAM (Kernel Average Misorientation) being 0° to 2° is 90% or higher. An object of the present invention is to provide a MgO sintered sputtering target capable of reducing particles.

16 Claims, 1 Drawing Sheet

(56) References Cited

U.S. PATENT DOCUMENTS

| | | | |
|---|---|---|---|
| 9,988,709 | B2 | 6/2018 | Hisano et al. |
| 10,066,290 | B1 | 9/2018 | Hisano et al. |
| 2008/0289958 | A1* | 11/2008 | Kardokus ............... C22F 1/18 204/298.12 |
| 2010/0294657 | A1 | 11/2010 | Nagano et al. |
| 2011/0143460 | A1* | 6/2011 | Tsunekawa ........... C23C 14/081 438/3 |
| 2018/0237901 | A1* | 8/2018 | Mori ...................... C22F 1/08 |

FOREIGN PATENT DOCUMENTS

| | | |
|---|---|---|
| JP | 2000-169956 A | 6/2000 |
| JP | 2003-027221 A | 1/2003 |

OTHER PUBLICATIONS

Kyohei Nomura et al., "Effect of the Grain Size on Plastic Strain Analysis by EBSD for Austenitic Stainless Steels with Tensile Strain at 650° C.", Journal of the Society of Materials Science, Japan, vol. 61, No. 4, pp. 371-376, Apr. 2012 (English Abstract).

Shota Umezaki et al., "Quantitative Analysis of Dislocation Density in an Austenitic Steel after Plastic Deformation", Journal of Japan Institute of Metals and Materials, vol. 78, No. 6, pp. 218-224, Jun. 2014 (English Abstract).

Extended European Search Report issued in corresponding European Patent Application No. EP 19823756.2 dated May 27, 2021.

* cited by examiner

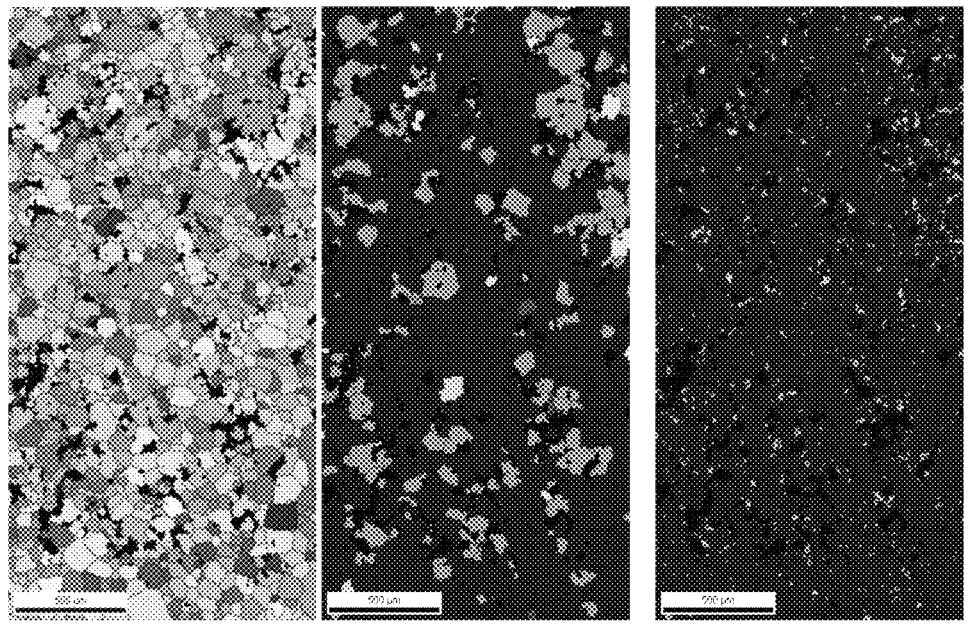
GOS                KAM

MGO SINTERED SPUTTERING TARGET

BACKGROUND

The present invention relates to a MgO sintered sputtering target suitable for forming magnesium oxide (MgO)-based thin films for use in electronic devices such as magnetic recording mediums of magnetic disk devices, tunnel magnetoresistance (TMR) devices, and NAND-type flash memories, and in particular relates to a MgO sintered sputtering target in which only few particles are generated during sputtering.

Pursuant to the miniaturization and high recording densification of magnetic disk devices, research and development of magnetic recording mediums are being conducted, and various improvements are being made in magnetic layers and foundation layers. For example, a spin torque-type magnetoresistance memory (MRAM) is capable of realizing lower power consumption and miniaturization in comparison to conventional MRAMs by controlling the magnetization based on the spin of electrons flowing through the tunnel junction of the current flowing through the TMR device.

Magnesium oxide (MgO) is being used as the tunnel insulating film of TMR devices. While tunnel resistance will increase as the band gap is larger, when the device size is reduced in order to increase the scale of integration of the TMR device, there is a problem in that the resistance of the device will increase. Thus, considered may be lowering the device resistance by reducing the film thickness of the tunnel insulating film which affects the device resistance.

A MgO film is normally deposited based on the sputtering method by using a MgO sintered sputtering target. Nevertheless, since particles are generated during sputtering and may deteriorate the characteristics of the film and device, the reduction of particles is required. In particular, stricter control of the generation of particles is required pursuant to the miniaturization of devices and the production of thinner films.

MgO sintered sputtering targets are described in, for instance, Patent Documents 1 and 2. Patent Document 1 discloses a MgO sintered target for sputtering having crystal anisotropy in which many (111) planes are oriented toward a plane that was subject to uniaxial pressure.

Moreover, Patent Document 2 discloses a sputtering target using a magnesium oxide sintered body which has, in terms of mass %, a purity of 99.99% or higher, a relative density that is higher than 98%, and an average crystal grain size of 8 μm or less, wherein a peak intensity ratio I(111)/I(200) based on X-ray diffraction is 8% or higher and less than 25%.

CITATION LIST

Patent Documents

[Patent Document 1] Japanese Unexamined Patent Application Publication No. 2009-173502
[Patent Document 2] Japanese Patent No. 6069214

Non-Patent Documents

[Non-Patent Document 1] Kyohei Nomura et al, "Effect of the Grain Size on Plastic Strain Analysis by EBSD for Austenitic Stainless Steels with Tensile Strain at 650° C.", Journal of the society of Materials Science, Japan, April 2012, Vol. 61, No. 4, pp. 371-376

[Non-Patent Document 2] Shota Umezaki et al, "Quantitative Analysis of Dislocation Density in an Austenitic Steel after Plastic Deformation", J. Japan Institute of Metals and Materials, Vol. 78, No. 6 (2014), pp. 218-224

SUMMARY

In order to suppress the generation of particles, it is effective to control the crystal grain size and orientation of the MgO sintered body target. Nevertheless, while the crystal grain size and orientation have previously been controlled by adjusting the sintering conditions and the like, there was a problem in that the number of particles still could not be reduced even when the foregoing control was performed. Accordingly, an object of the present invention is to provide a MgO sintered sputtering target capable of reducing particles.

As a result of intense study regarding the strain within the crystal grains in a MgO sintered sputtering target, the present inventors discovered that, when the strain within the crystal grains in a sputtering target is small, particles are not generated easily during sputtering. Based on this kind of discovery, the present invention provides the following MgO sintered sputtering target as its embodiment.

1) A MgO sintered sputtering target, wherein a ratio of GOS (Grain Orientation Spread) being 0° to 1° is 75% or higher.
2) A MgO sintered sputtering target, wherein a ratio of GOS (Grain Orientation Spread) being 0° to 1° is 90% or higher.
3) A MgO sintered sputtering target, wherein a ratio of KAM (Kernel Average Misorientation) being 0° to 2° is 85% or higher.
4) A MgO sintered sputtering target, wherein a ratio of KAM (Kernel Average Misorientation) being 0° to 2° is 95% or higher.
5) The MgO sintered sputtering target according to any one of 1) to 4) above, wherein the MgO sintered sputtering target has an average crystal grain size of 30 μm or more.
6) The MgO sintered sputtering target according to any one of 1) to 5) above, wherein the MgO sintered sputtering target has a relative density of 99.9% or higher.

The present invention yields a superior effect of being able to reduce the generation of particles during sputtering. As a result of depositing films using this kind of MgO sintered sputtering target, the quality of the sputtered film can be improved and, therefore, the present invention can contribute to the stabilization of quality and the improvement in yield of devices.

BRIEF DESCRIPTION OF DRAWINGS

FIG. 1 is a diagram showing the result of analyzing the MgO sintered sputtering target of Example 1 based on EBSD.

DETAILED DESCRIPTION

A method of quantifying the strain within the crystal grains by using electron backscatter diffraction (EBSD) is known (Non-Patent Documents 1 and 2, etc.). As the calculation techniques of quantifying the strain within the crystal grains by using EBSD, there are 1) GOS (Grain Orientation Spread) in which the average misorientation within the crystal grains is quantified, and 2) KAM (Kernel Average Misorientation) in which the misorientation between an arbitrary measurement point and an adjacent measurement point within the crystal grains is quantified.

As a result of analyzing MgO sintered sputtering targets by using the foregoing methods, the present inventors discovered that there is a correlation between the amount of strain within the crystal grains configuring the sputtering target and the number of particles that are generated during sputtering, and were able to suppress the generation of particles by adjusting the amount of strain within the crystal grains to be within a certain numerical range.

The MgO sintered sputtering target according to an embodiment of the present invention is characterized in that a ratio of a GOS value being 0° to 1° is 75% or higher. Generally speaking, the GOS value decreases as the amount of strain within the crystal grains is smaller. In an embodiment of the present invention, by causing the ratio of the GOS value being 0° to 1° to be 75% or higher, the number of particles during sputtering is reduced. Preferably, the ratio of the GOS value being 0° to 1° is 90% or higher.

The MgO sintered sputtering target according to an embodiment of the present invention is characterized in that a KAM value being 0° to 2° is 85% or higher. Generally speaking, the KAM value decreases as the amount of strain within the crystal grains is smaller. In an embodiment of the present invention, by causing the ratio of the KAM value being 0° to 2° to be 85% or higher, the number of particles during sputtering is reduced. Preferably, the ratio of the KAM value being 0° to 2° is 95% or higher.

Moreover, the MgO sintered sputtering target according to an embodiment of the present invention preferably has an average crystal grain size of 30 μm or more. When the average crystal grain size is less than 30 μm, there are cases where the number of particles generated cannot be reduced.

Moreover, the MgO sintered sputtering target according to an embodiment of the present invention preferably has a relative density of 99.9% or higher. When the density decreases due to voids or the like within the sintered body, there are cases where particles are generated with such voids or the like as the origin.

The MgO sintered sputtering target according to an embodiment of the present invention can be prepared as follows.

Foremost, as the MgO raw material powder, a powder in which the grain size distribution of the grain diameter measured based on the laser diffraction and scattering method is D10: 0.4 μm, D50: 0.7 μm, D90: 1.9 μm is prepared. The use of a raw material powder having a narrow grain size distribution contributes to the reduction of the GOS value and the KAM value.

Next, the MgO raw material powder of the foregoing conditions is filled in a carbon die, and subject to hot press sintering in a vacuum or an inert atmosphere. Here, the sintering temperature is preferably 1300° C. or higher and 1800° C. or less, the sintering time is preferably 2 to 6 hours, and the pressing pressure is preferably 100 to 400 kgf/cm². Increasing the sintering temperature and prolonging the sintering time contribute to the reduction of the GOS value and the KAM value.

The rate of temperature increase of hot press is preferably 3° C./min or more (temperature range of 500° C. or higher), and the rate of temperature decrease of hot press is preferably −3° C./min or more (temperature range of 500° C. or higher). Accelerating the rate of temperature increase and the rate of temperature decrease of hot press contributes to the reduction of the GOS value and the KAM value.

Moreover, the MgO sintered body may also be heated in the atmosphere after undergoing hot press sintering. The performance of atmospheric heating further contributes to the reduction of the GOS value and the KAM value. Atmospheric heating is preferably performed at a temperature of 1200° C. or higher and 1400° C. or less for 1 to 3 hours. Moreover, the MgO sintered body may also be subject to HIP treatment after undergoing hot press sintering. The performance of HIP treatment further contributes to the reduction of the GOS value and the KAM value.

The intended MgO sintered sputtering target can be obtained by performing finish processing, such as cutting and polishing, to the MgO sintered body after undergoing hot press or after atmospheric heating or after HIP treatment.

The evaluation method in the present disclosure was as follows in both the Examples and Comparative Examples.

(Measurement Method of GOS and KAM)

Three pieces from different sections (center part, radius ½, periphery part) in a disk-shaped MgO sputtering target were prepared. Each piece was cut along a plane that is parallel to the sputter surface, and the cut section was mirror-polished for use as a measurement sample for EBSD. Next, an analytical ultra-high resolution scanning electron microscope (SU-70 manufactured by Hitachi Technologies) was used to perform electron backscatter diffraction (EBSD) analysis. Here, the sample was placed on a stage inclined 70°, and EBSD analysis was performed at an accelerating voltage of 15 kV. The crystal orientation was measured in each sample, and the obtained data was subject to EBSD analyzing software (OIM Analysis manufactured by TSL Solutions) to calculate the GOS value and the KAM value of each sample, and the average values thereof were thereby obtained.

(Measurement Method of Average Crystal Grain Size)

The surface of the MgO sputtering target was observed using a laser microscope, and the magnification was set so that roughly 15 crystal grains will appear in the horizontal direction of the microscopic image. Next, after drawing straight lines to divide the microscopic image into thirds vertically and horizontally, the vertical length, horizontal length and scale length of the image were measured. Next, after counting the respective lines and the points that intersected with the grain boundary, the respective values were introduced into the following formula to measure the average crystal grain size.

$$\text{Average crystal grain size} = ([\text{vertical length}] + [\text{horizontal length}] \times 2 \times [\text{scale value}]) / ([\text{scale length}] \times [\text{total number of points that intersected with the grain boundary}])$$

(Measurement Method of Relative Density)

The relative density was calculated by measuring the density of the sintered body based on the Archimedean method.

$$\text{Relative density (\%)} = \text{measured density} / \text{theoretical density} (3.65 \text{ g/cm}^3) \times 100.$$

EXAMPLES

The present invention is now explained with reference to the following Examples and Comparative Examples. Note that the following Examples are merely illustrative, and the present invention shall in no way be limited thereby. In other words, the present invention is limited only by the scope of its claims, and various modifications other than the Examples are also covered by the present invention.

Example 1

A MgO raw material powder in which the grain size distribution of the grain diameter measured based on the laser diffraction and scattering method is D10: 0.4 m, D50: 0.7 D90: 1.9 µm was prepared. Next, the MgO raw material powder was filled in a carbon die, and thereafter subject to hot press sintering in a vacuum at a sintering temperature of 1500° C. for 6 hours. Here, the rate of temperature increase was set to 3° C./min and the rate of temperature decrease was set to −3° C./min. The obtained MgO sintered body had a GOS value (ratio of 0° to 1°) of 84% and a KAM value (ratio of 0° to 2°) of 94%, and the intended results were obtained. Moreover, the average crystal grain size was 50 µm and the relative density was 99.99%.

Next, the sintered body was processed into a sputtering target, sputtering was implemented, and a MgO film was deposited on a wafer. As a result of counting the number of particles having a grain size of 0.05 µm or more on the wafer (n=5 wafers), it was possible to reduce the number of particles to be less than 50 particles on average.

Example 2

Other than adjusting the grain size distribution of the grain diameter of the MgO raw material powder measured based on the laser diffraction and scattering method, a MgO sintered sputtering target was prepared based on the same method as Example 1. Note that a MgO raw material powder in which the grain size distribution of the grain diameter is D10: 0.2 µm, D50: 0.4 µm, D90: 1.4 µm was used. The obtained MgO sintered body had a GOS value (ratio of 0° to 1°) of 84% and a KAM value (ratio of 0° to 2°) of 94%, and the intended results were obtained. Moreover, the average crystal grain size was 50 µm and the relative density was 99.99%.

Next, the sintered body was processed into a sputtering target, sputtering was implemented under the same conditions as Example 1, and a MgO film was deposited on a wafer. As a result of counting the number of particles having a grain size of 0.05 µm or more on the wafer (n=5 wafers), it was possible to reduce the number of particles to be less than 50 particles on average.

Examples 3 to 6

Other than adjusting the sintering temperature and sintering time of hot press, a MgO sintered sputtering target was prepared based on the same method as Example 1. Note that the conditions were changed as follows; specifically, in Example 3 the sintering temperature was set to 1400° C., in Example 4 the sintering temperature was set to 1600° C., in Example 5 the sintering time was set to 3 hours, and in Example 6 the sintering time was set to 10 hours. The GOS values (ratio of 0° to 1°) of the obtained MgO sintered body were respectively 81% (Example 3), 89% (Example 4), 81% (Example 5), and 89% (Example 6), and the KAM values (ratio of 0° to 2°) of the obtained MgO sintered body were respectively 91% (Example 3), 94% (Example 4), 92% (Example 5), and 94% (Example 6), and the intended results were obtained. Moreover, the average crystal grain size was 30 µm or more and the relative density was 99.99% in all cases.

Next, these MgO sintered bodies were processed into a sputtering target, sputtering was implemented under the same conditions as Example 1, and a MgO film was deposited on a wafer. As a result of counting the number of particles having a grain size of 0.05 µm or more on the wafer (n=5 wafers), it was possible to reduce the number of particles to be less than 50 particles on average.

Examples 7 and 8

Other than adjusting the rate of temperature increase or the rate of temperature decrease of hot press, a MgO sintered sputtering target was prepared based on the same method as Example 1. Note that in Example 7 the rate of temperature increase was set to 10° C./min and the rate of temperature decrease was set to −10° C./min, and in Example 8 the rate of temperature increase was set to 3° C./min and the rate of temperature decrease was set to −3° C./min. Note that the rate of temperature increase and the rate of temperature decrease are within a temperature range of 500° C. or higher in all cases. The GOS values (ratio of 0° to 1°) of the obtained MgO sintered body were respectively 82% (Example 7) and 90% (Example 8), and the KAM values (ratio of 0° to 2°) of the obtained MgO sintered body were respectively 92% (Example 7) and 95% (Example 8), and the intended results were obtained. Moreover, the average crystal grain size was 30 µm or more and the relative density was 99.99% in all cases.

Next, these MgO sintered bodies were processed into a sputtering target, sputtering was implemented under the same conditions as Example 1, and a MgO film was deposited on a wafer. As a result of counting the number of particles having a grain size of 0.05 µm or more on the wafer (n=5 wafers), it was possible to reduce the number of particles to be less than 50 particles on average.

Examples 9 and 10

With regard to a MgO sintered sputtering target prepared based on the same conditions as Example 1, in Example 9 atmospheric heating was subsequently performed, and in Example 10 HIP treatment was subsequently performed. The conditions of the atmospheric heating were a heating temperature of 1300° C. and a heating time of 2 hours. Moreover, the conditions of the HIP treatment were a treatment temperature of 1300° C., a treatment time of 2 hours, and a pressing pressure of 1000 kgf/cm$^2$. The GOS values (ratio of 0° to 1°) of the obtained MgO sintered bodies after undergoing treatment were respectively 94% (Example 9) and 97% (Example 10), and the KAM values (ratio of 0° to 2°) of the obtained MgO sintered bodies after undergoing treatment were respectively 97% (Example 9) and 98% (Example 10). Moreover, the average crystal grain size was 30 µm or more and the relative density was 99.99% in all cases.

Next, these MgO sintered bodies were processed into a sputtering target, sputtering was implemented under the same conditions as Example 1, and a MgO film was deposited on a wafer. As a result of counting the number of particles having a grain size of 0.05 µm or more on the wafer (n=5 wafers), it was possible to significantly reduce the number of particles to be less than 30 particles on average in all cases.

Examples 11 to 13

A MgO sintered body was prepared by additionally changing the hot press conditions (holding temperature, rate of temperature increase, rate of temperature decrease) and the HIP treatment condition (holding temperature) in Example 1 described above. The hot press conditions and the HIP treatment conditions were set as per Table 1. The GOS values (ratio of 0° to 1°) of the obtained MgO sintered bodies were respectively 78% (Example 11), 92% (Example 12), and 93% (Example 13), and the KAM values (ratio of 0° to 2°) of the obtained MgO sintered bodies were respectively 87% (Example 11), 99% (Example 12), and 99% (Example 13), and it was confirmed that these values improved in comparison to Example 1 in all cases. Moreover, the average crystal grain size was 30 μm or more and the relative density was 99.99% in all cases.

Next, these MgO sintered bodies were processed into a sputtering target, sputtering was implemented under the same conditions as Example 1, and a MgO film was deposited on a wafer. As a result of counting the number of particles having a grain size of 0.05 μm or more on the wafer (n=5 wafers), it was possible to significantly reduce the number of particles to be less than 30 particles on average in all cases.

Comparative Example 1

Other than adjusting the grain size distribution of the grain diameter of the MgO raw material powder measured based on the laser diffraction and scattering method, a MgO sintered sputtering target was prepared based on the same method as Example 1. Note that a MgO raw material powder in which the grain size distribution of the grain diameter is D10: 0.1 μm, D50: 0.7 μm, D90: 2.8 μm was used. The obtained MgO sintered body had a GOS value (ratio of 0° to 1°) of 72% and a KAM value (ratio of 0° to 2°) of 85%, and the intended results were not obtained.

Next, the sintered body was processed into a sputtering target, sputtering was implemented under the same conditions as Example 1, and a MgO film was deposited on a wafer. As a result of counting the number of particles having a grain size of 0.05 μm or more on the wafer (n=5 wafers), the number of particles exceeded 100 particles on average, and the number of particles increased considerably in comparison to the Examples.

Comparative Examples 2 and 3

Other than adjusting the sintering conditions of hot press, a MgO sintered sputtering target was prepared based on the same method as Example 1. Note that in Comparative Example 2 the rate of temperature increase was set to 20° C./min and the rate of temperature decrease was set to −20° C./min, and in Example 3 the sintering temperature was set to 1200° C. The GOS values (ratio of 0° to 1°) of the obtained MgO sintered body were respectively 74% (Comparative Example 2) and 69% (Comparative Example 3), and the KAM values (ratio of 0° to 2°) of the obtained MgO sintered body were respectively 81% (Comparative Example 2) and 78% (Comparative Example 3), and the intended results were not obtained. Moreover, the average crystal grain size was 15 μm and the relative density was a low density of 99.7% in Comparative Example 3.

Next, these MgO sintered bodies were processed into a sputtering target, sputtering was implemented under the same conditions as Example 1, and a MgO film was deposited on a wafer. As a result of counting the number of particles having a grain size of 0.05 μm or more on the wafer (n=5 wafers), the number of particles exceeded 100 particles on average, and the number of particles increased considerably in comparison to the Examples.

The foregoing results are shown in Table 1.

TABLE 1

| | MgO raw material powder | | | Hot press | | | | Atmospheric heating | | HIP treatment |
|---|---|---|---|---|---|---|---|---|---|---|
| | | | | Temperature [° C.] | Time [h] | Rate of temperature increase [° C./min] | Rate of temperature decrease [° C./min] | Temperature [° C.] | Time [h] | Temperature [° C.] |
| | D10 [μm] | D50 [μm] | D90 [μm] | | | *Temperature range of 500° C. or higher | | | | |
| Example 1 | 0.4 | 0.7 | 1.9 | 1500 | 6 | 5 | −5 | — | — | — |
| Example 2 | 0.2 | 0.4 | 1.4 | 1500 | e | 5 | −5 | — | — | — |
| Example 3 | 0.4 | 0.7 | 1.9 | 1350 | 6 | 5 | −5 | — | — | — |
| Example 4 | 0.4 | 0.7 | 1.9 | 1600 | 6 | 5 | −5 | — | — | — |
| Example 5 | 0.4 | 0.7 | 1.9 | 1500 | 3 | 5 | −5 | — | — | — |
| Example 6 | 0.4 | 0.7 | 1.9 | 1500 | 10 | 5 | −5 | — | — | — |
| Example 7 | 0.4 | 0.7 | 1.9 | 1500 | 6 | 10 | −10 | — | — | — |
| Example 8 | 0.4 | 0.7 | 1.9 | 1500 | 6 | 3 | −3 | — | — | — |
| Example 9 | 0.4 | 0.7 | 1.9 | 1500 | 6 | 5 | −5 | 1300 | 2 | — |
| Example 10 | 0.4 | 0.7 | 1.9 | 1500 | 6 | 5 | −5 | — | — | 1300 |
| Example 11 | 0.4 | 0.7 | 1.9 | 1500 | 6 | 15 | −15 | — | — | — |
| Example 12 | 0.4 | 0.7 | 1.9 | 1750 | 6 | 5 | −5 | — | — | — |
| Example 13 | 0.4 | 0.7 | 1.9 | 1500 | 6 | 3 | −3 | — | — | 1700 |
| Comparative Example 1 | 0.1 | 0.7 | 2.8 | 1500 | 6 | 5 | −5 | — | — | — |
| Comparative Example 2 | 0.4 | 0.7 | 1.9 | 1500 | 6 | 20 | −20 | — | — | — |
| Comparative Example 3 | 0.4 | 0.7 | 1.9 | 1200 | 6 | 5 | −5 | — | — | — |

TABLE 1-continued

| | HIP treatment | | Sintered body | | | | Number of particles generated [particles] (*Particles of 0.05um or larger were counted) | | |
|---|---|---|---|---|---|---|---|---|---|
| | Time [h] | Pressure [kgf/cm²] | Grain size [um] | Relative density [%] | GOS value | KAM value | Maximum value | Minimum value | Average value |
| Example 1 | — | — | 50 | 99.99 | 87% | 99% | 48 | 25 | 27 |
| Example 2 | — | — | 50 | 99.99 | 81% | 92% | 47 | 28 | 38 |
| Example 3 | — | — | 40 | 99.99 | 81% | 91% | 46 | 32 | 38 |
| Example 4 | — | — | 120 | 99.99 | 89% | 94% | 43 | 25 | 38 |
| Example 5 | — | — | 35 | 99.99 | 81% | 92% | 48 | 28 | 35 |
| Example 6 | — | — | 80 | 99.99 | 89% | 94% | 47 | 32 | 38 |
| Example 7 | — | — | 45 | 99.99 | 82% | 92% | 43 | 32 | 28 |
| Example 8 | — | — | 65 | 99.99 | 90% | 95% | 31 | 16 | 22 |
| Example 9 | — | — | 55 | 99.99 | 94% | 97% | 28 | 15 | 19 |
| Example 10 | 2 | 1000 | 55 | 99.99 | 97% | 98% | 29 | 17 | 21 |
| Example 11 | — | — | 47 | 99.99 | 78% | 87% | 43 | 32 | 28 |
| Example 12 | — | — | 200 | 99.99 | 92% | 99% | 27 | 15 | 19 |
| Example 13 | 2 | 1000 | 400 | 99.99 | 93% | 99% | 25 | 13 | 18 |
| Comparative Example 1 | — | — | 50 | 99.99 | 72% | 85% | 152 | 65 | 103 |
| Comparative Example 2 | — | — | 50 | 99.99 | 74% | 81% | 176 | 79 | 121 |
| Comparative Example 3 | — | — | 15 | 99.7 | 69% | 78% | 291 | 63 | 143 |

The MgO sintered sputtering target according to an embodiment of the present invention yields a superior effect of being able to reduce the generation of particles during sputtering. As a result of depositing films using this kind of MgO sintered sputtering target, the quality of the sputtered film can be improved. The MgO sintered sputtering target according to an embodiment of the present invention is particularly useful in forming a tunnel film of a TMR device for use in a spinel-type MRAM.

The invention claimed is:

1. A MgO sintered sputtering target, wherein a ratio of GOS (Grain Orientation Spread) being 0° to 1° is 75% or higher.

2. The MgO sintered sputtering target according to claim 1, wherein the ratio of GOS (Grain Orientation Spread) being 0° to 1° is 90% or higher.

3. A MgO sintered sputtering target, wherein a ratio of KAM (Kernel Average Misorientation) being 0° to 2° is 85% or higher.

4. The MgO sintered sputtering target according to claim 3, wherein the ratio of KAM (Kernel Average Misorientation) being 0° to 2° is 95% or higher.

5. The MgO sintered sputtering target according to claim 4, wherein the MgO sintered sputtering target has an average crystal grain size of 30 μm or more.

6. The MgO sintered sputtering target according to claim 5, wherein the MgO sintered sputtering target has a relative density of 99.9% or higher.

7. The MgO sintered sputtering target according to claim 4, wherein the MgO sintered sputtering target has a relative density of 99.9% or higher.

8. The MgO sintered sputtering target according to claim 3, wherein the MgO sintered sputtering target has an average crystal grain size of 30 μm or more.

9. The MgO sintered sputtering target according to claim 8, wherein the MgO sintered sputtering target has a relative density of 99.9% or higher.

10. The MgO sintered sputtering target according to claim 3, wherein the MgO sintered sputtering target has a relative density of 99.9% or higher.

11. The MgO sintered sputtering target according to claim 2, wherein the MgO sintered sputtering target has an average crystal grain size of 30 μm or more.

12. The MgO sintered sputtering target according to claim 11, wherein the MgO sintered sputtering target has a relative density of 99.9% or higher.

13. The MgO sintered sputtering target according to claim 2, wherein the MgO sintered sputtering target has a relative density of 99.9% or higher.

14. The MgO sintered sputtering target according to claim 1, wherein the MgO sintered sputtering target has an average crystal grain size of 30 μm or more.

15. The MgO sintered sputtering target according to claim 14, wherein the MgO sintered sputtering target has a relative density of 99.9% or higher.

16. The MgO sintered sputtering target according to claim 1, wherein the MgO sintered sputtering target has a relative density of 99.9% or higher.

* * * * *